(12) United States Patent
Shiga

(10) Patent No.: US 6,590,813 B2
(45) Date of Patent: Jul. 8, 2003

(54) SEMICONDUCTOR MEMORY AND METHOD OF CONTROLLING THE SAME

(75) Inventor: Hitoshi Shiga, Yokohama (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 0 days.

(21) Appl. No.: 10/180,076

(22) Filed: Jun. 27, 2002

(65) Prior Publication Data

US 2003/0058692 A1 Mar. 27, 2003

Related U.S. Application Data

(62) Division of application No. 09/707,845, filed on Nov. 8, 2000, now Pat. No. 6,434,080.

(30) Foreign Application Priority Data

Nov. 8, 1999 (JP) ............................................. 11-316487

(51) Int. Cl.[7] .............................. G11C 16/04; G11C 8/00
(52) U.S. Cl. ............................. 365/189.09; 365/230.08; 365/230.06
(58) Field of Search ....................... 365/189.09, 189.04, 365/230.08, 230.06, 185.23

(56) References Cited

U.S. PATENT DOCUMENTS

| 6,031,411 | A | 2/2000 | Tsay et al. | 327/536 |
|---|---|---|---|---|
| 6,118,699 | A | 9/2000 | Tatsumi et al. | 365/185.18 |
| 6,437,636 | B2 * | 8/2002 | Zammattio et al. | 327/536 |
| 6,459,643 | B2 * | 10/2002 | Kondo et al. | 365/226 |

FOREIGN PATENT DOCUMENTS

JP 11016368 1/1999

* cited by examiner

Primary Examiner—Michael S. Lebentritt
Assistant Examiner—Anh Phung
(74) Attorney, Agent, or Firm—Banner & Witcoff, Ltd.

(57) ABSTRACT

A semiconductor memory has a memory cell array, a boosted voltage generator to generate a boosted voltage and a decoder to select memory cells in said memory cell array in response to an address signal. The voltage generator is activated in response to input of a first command, and kept active for a period of repeated input of a second command to control for the voltage generator, following the first command. The semiconductor memory may be provided with a regular operation mode in which the voltage generator is controlled to be in an active or inactive state by means of a first command signal in response to a predetermined signal, and a successive operation mode in which the voltage generator is kept active by a second command signal in response to another predetermined signal.

15 Claims, 11 Drawing Sheets

US 6,590,813 B2

SEMICONDUCTOR MEMORY AND METHOD OF CONTROLLING THE SAME

CROSS REFERENCE TO RELATED APPLICATIONS

This application is a Divisional of U.S. application Ser. No. 09/707,845 filed Nov. 8, 2000 now U.S. Pat. No. 6,434,080 issued on Aug. 13, 2002.

The subject application is related to subject matter disclosed in Japanese Patent Application No. H 11-316487 filed on Nov. 8, 1999, in Japan to which the subject application claims priority under Paris Convention and which is incorporated herein by reference.

BACKGROUND OF THE INVENTION

The present invention relates to a semiconductor memory, such as, EEPROM, having a built-in boosted voltage generator and a method of controlling such a semiconductor device.

Recent EEPROM-flash memories are provided with an automatic data-writing function. In this function, input of a write command, an address and data initiates automatic data writing and automatic verification of the written data in the chip. Moreover, the input of an erase command and an address initiates automatic erasing and automatic verification of data erasing and the erased data in the chip.

Well known NOR-type flash memories have a small number of sense-amplifiers compared to the bit lines in a memory cell array. The number of the sense-amplifiers, for example, corresponds to just one word (16 bit)-data. Data writing to a plurality of addresses (words) thus requires designation of the next write address and data for re-input of a write command whenever a writing operation for the former address is completed.

EEPROM-flash memories therefore require a very long data-writing period to rewrite a large amount of data for program or audio data recording.

A boosted voltage generator installed in the EEPROM-flash memory is turned on and off for a writing operation to each address in an automatic writing operation, thus requiring a waiting period at an initial writing stage to each address for stable voltage generation. Such a waiting period also makes for a long writing period and increases power consumption.

Another type of NOR-type flash memory for automatic data writing with one page-internal data (a plurality of words corresponding to one page) requires a data latch for holding one page-data in addition to sense-amplifiers for one word, thus resulting in a complex structure and control.

SUMMARY OF THE INVENTION

A purpose of the present invention is to provide a semiconductor memory and a method of controlling the memory a smaller data-writing period and less power consumption.

The present invention provides a semiconductor memory including: a memory cell array; a boosted voltage generator for generating a boosted voltage; a decoder for selecting memory cells in the memory cell array in response to an address signal; and a controller for activating the voltage generator in response to input of a first command, and keeping the voltage generator in active during repeated input of a second command for controlling the voltage generator, following to the first command.

Moreover, the present invention provides a semiconductor memory including: a memory cell array; a boosted voltage generator for generating a boosted voltage; a decoder for selecting memory cells in the memory cell array in response to an address signal; and a controller, having an input terminal, for controlling the voltage generator to be in an active or inactive state. The semiconductor memory has a regular operation mode in which the voltage generator is controlled to be the active or the inactive state by means of a first control signal output by the controller in response to a predetermined signal supplied to the input terminal, and a successive operation mode in which the voltage generator is kept active by means of a second control signal output by the controller in response to another predetermined signal supplied to the input terminal.

Furthermore, the present invention provides a semiconductor memory including: a memory cell array; a boosted voltage generator for generating a boosted voltage; a decoder for selecting memory cells in the memory cell array in response to an address signal; and a controller for activating the voltage generator for a predetermined period in response to input of a first command, and keeping the voltage generator active in response to input of a second command within the period, while deactivating the voltage generator when no input of the second command is received within the period.

Moreover, the present invention provides a semiconductor memory including: a memory cell array; a boosted voltage generator having a first booster circuit that is controlled to be in an active or inactive state to generate a boosted voltage, and a second booster circuit that is always controlled in an active state to generate another boosted voltage; a regulator for regulating the output level of the voltage generator according to an operation mode; a decoder for selecting memory cells in the memory cell array in response to an address signal; and a controller for continuously activating the first circuit for a period during repeated input of a plurality of address signals and data to be written in response to input of a predetermined command.

Furthermore, the present invention provides a semiconductor memory including: a memory cell array having nonvolatile memory cells; a boosted voltage generator for generating a boosted voltages for data-writing and data-reading to and from the memory cell array; a sense-amplifier for sensing data read from the memory cell array; a decoder for selecting memory cells in the memory cell array in response to an address signal; and a controller for controlling an automatic writing operation to write data and verify written data to said memory cell array based on input of a write command, an address and data, and to verify written data. The semiconductor memory has a successive writing mode in which a booster circuit of the voltage generator for data-writing is kept in an active state without returning to an inactive state for completion of writing to each address when writing to a repeatedly-entered plurality of addresses.

Moreover, the present invention provides a semiconductor memory including: a memory cell array; a boosted voltage generator for generating a boosted voltage; a decoder for selecting memory cells in the memory cell array in response to an address signal; and a controller for providing a command to control the voltage generator. The command has a mode wherein the voltage generator is turned on and continues operation until input of the command to the controller to turn off the voltage generator.

Moreover, the present invention includes a semiconductor memory including: a memory cell array having nonvolatile memory cells; a boosted voltage generator for generating a boosted voltage for data-writing and data-reading to and from the memory cell array; a sense-amplifier for sensing data read from the memory cell array; a decoder for selecting memory cells in the memory cell array in response to an address signal; and a controller for controlling an automatic writing operation to write data and verify written data to the memory cell array based on the input of a write command, an address and data, and to verify written data. An internal timer level for automatic operation varies from a level for regular operation while a command is input to the controller, the command has a mode in which the voltage generator is turned on and continues operation until the input of the command to the controller to turn off the voltage generator.

Moreover, the present invention provides a method of controlling a semiconductor memory having a built-in boosted voltage generator for generating a boosted voltage for a write-operation control, comprising the steps of: setting a successive writing mode in which the voltage generator is kept active by input of a first command, an address signal and data to be written; and writing data to a plurality of addresses while the voltage generator is kept active by repeated input of a second command and an address signal and the corresponding data to be written, following the first command.

DETAILED DESCRIPTION OF PREFERRED EMBODIMENTS

Preferred embodiments according to the present invention will be disclosed with reference to the attached drawings.

Figure 1:
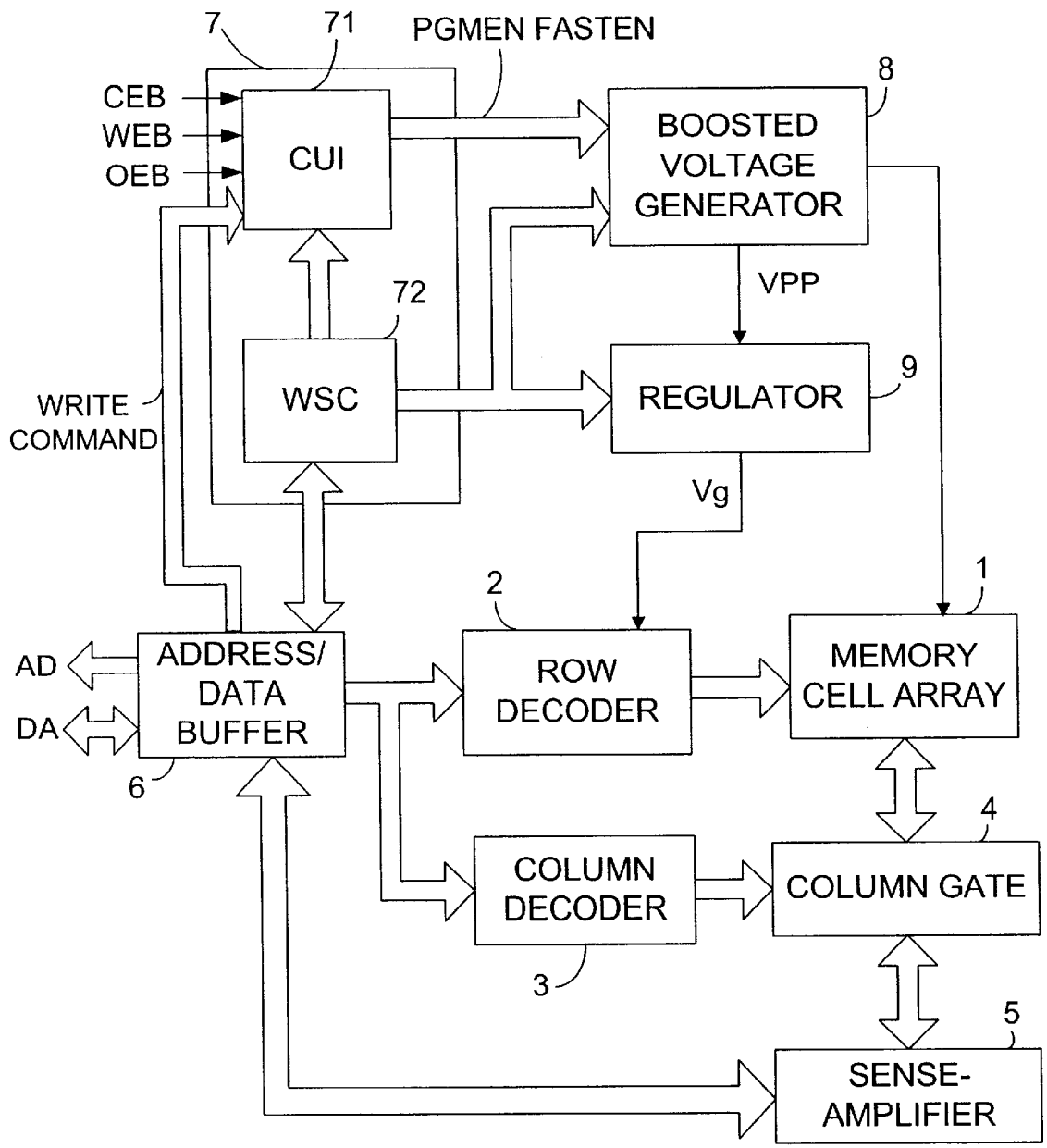
FIG. 1 shows an EEPROM flash memory as a preferred embodiment according to the present invention.

FIG. 1 shows a block diagram of an EEPROM flash memory as a preferred embodiment according to the present invention.

Figure 2:
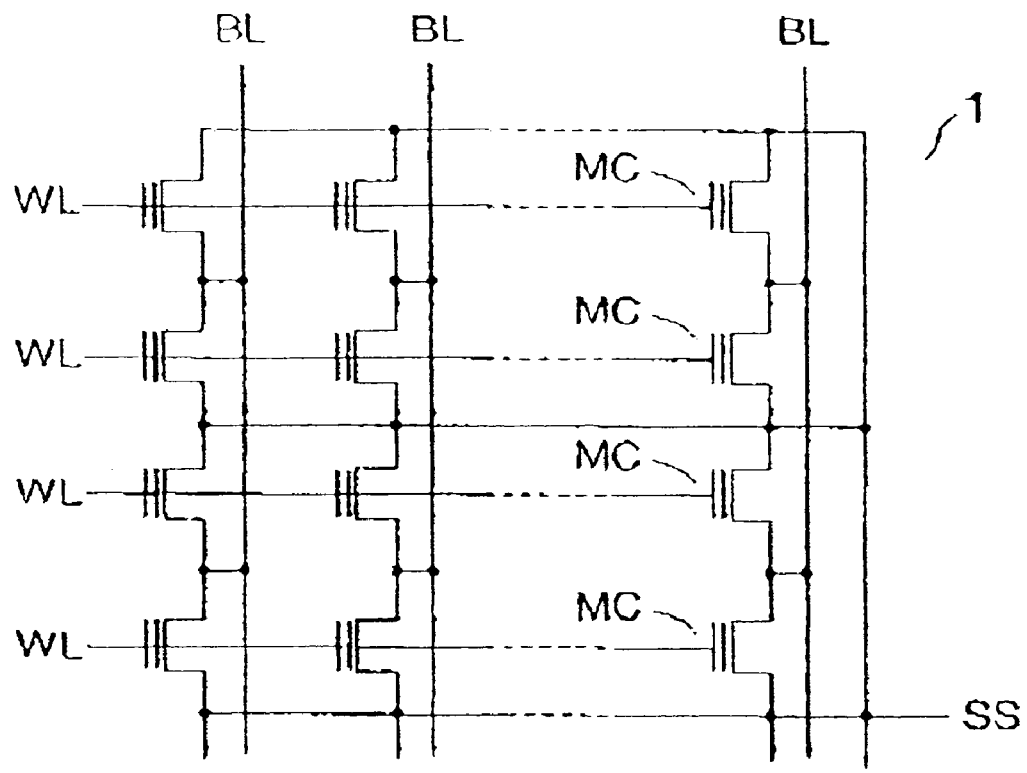
FIG. 2 illustrates an equivalent circuit of a memory cell array in this embodiment.

A memory cell array 1 is an electrically-rewritable non-volatile memory cell. As illustrated in FIG. 2, the memory cell array 1 has MOS transistor-type memory cells, MCs, each having stacked, floating and control gates, arranged and connected in NOR type. The drain, source and control gate of each cell MC are connected to a bit line BL, a common source line SS and a word line WL, respectively.

In FIG. 1, word lines WL are selected by a row decoder 2, and bit lines BL are selected by a column decoder 3 and a column gate 4 driven by the decoder 3.

An address AD is supplied to an address/data buffer 6. The row decoder 2 and the column decoder 3 decode a row address and a column address, respectively.

In data reading, bit line-data selected by the column gate 4 is detected and amplified by a sense-amplifier 5 and supplied to an I/O terminal (not shown) via the address/data buffer 6.

In data writing, data DA input via the I/O terminal is latched by the address/data buffer 6 and then transferred, via the sense-amplifier 5, to a bit line BL selected by the column gate 4. The sense-amplifier 5 may have a latching function.

In this embodiment, a data length for one writing/reading operation to/from the memory cell array 1 corresponds, for example, to one word (or 16 bits), which is decided by the number of I/O terminals (sense amplifiers 5). Therefore, when one page corresponds to a plurality of words, a plurality of address and data input operations are required for one page of data writing.

A boosted voltage generator 8 generates boosted voltages for data writing, erasing and reading. An output boosted voltage VPP is supplied to the row decoder 2 via a regulator 9 or directly to the memory cell array 1. In detail, the regulator 9 supplies a regulated voltage Vg to a word line WL in the memory cell array 1 selected by the row decoder 2 based on the voltage VPP.

A controller 7 has a command-user-interface (CUI) 71 and a write-state controller (WSC) 72, to control an automatic writing sequence.

Input to the CUI 71 includes a chip enable CEB, a write enable WEB, an output enable OEB and a write command. The write command is supplied to the address/data buffer 6, and includes an address, data and a series of command data according to a specific protocol, and is then supplied to the CUI 71.

The write command is decoded by the CUI 71 and supplied to the WSC 72 that performs an automatic writing-sequence control including control of the boosted voltage generator 8 and the regulator 9.

On decoding the write command, the CUI 71 generates activating signals PGMEN and FASTEN to turn on or off the boosted voltage generator 8 according to a write mode. The activating signals PGMEN and FASTEN are used in a regular write mode and also a successive write mode, which will be described later in detail.

Figure 3:
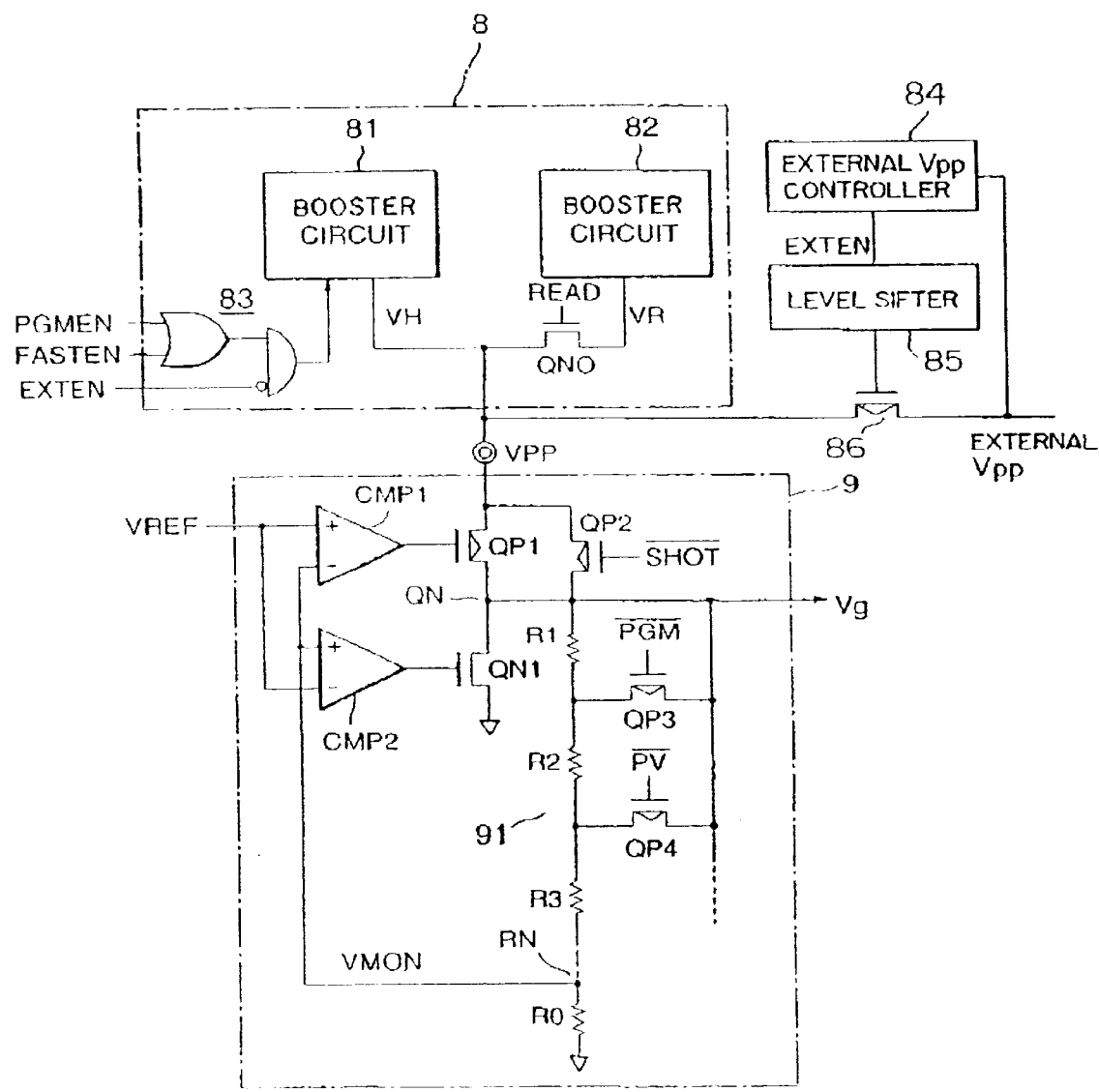
FIG. 3 shows block and circuit diagrams of a boosted voltage generator and a regulator in this embodiment.

FIG. 3 shows block and circuit diagrams of the boosted voltage generator 8 and the regulator 9.

The boosted voltage generator 8 has a booster circuit 81 for generating a high or an intermediate voltage for data writing/erasing, and a booster circuit 82 for generating a voltage for data reading. The circuits 81 and 82 include a well-known charge-pump.

The activating signal PGMEN is supplied to the booster circuit 81 for writing/erasing at its active-terminal via a logic gate 83 in the regular write mode while, in the successive write mode, both the activating signals PGMEN and FASTEN are supplied.

The booster circuit 81 for writing/erasing is activated in a write mode when either the activating signal PGMEN or FASTEN is at a high level whereas the booster circuit 81 is deactivated when both signals are at a low level. The booster circuit 82 is always active.

An output voltage VH of the booster circuit 81 for writing/erasing is supplied to a boost output terminal VPP whereas an output voltage VR of the booster circuit 82 is supplied to the terminal VPP via a transistor QN0 that is turned on in response to a read control signal READ. An output voltage appearing at the terminal VPP is supplied to the regulator 9.

As shown in FIG. 3, the regulator 9 has two comparators CMP1 and CMP2, and a PMOS transistor QP1 and an NMOS transistor QP2 connected in series across the terminal VPP and ground, and are selectively turned on and off by the outputs of the comparators.

A connection node QN for the transistors QP1 and QP2 is the output node for the regulated voltage Vg. Connected to the output node is a voltage divider 91 of resisters R1, R2, R3, . . . , and Ro connected in series.

A monitor output VMON appearing at a node RN for the resistor R0 is fed back to the inverting terminal and the non-inverting terminal of the comparators CMP1 and CMP2, respectively. A reference voltage VREF is supplied to the non-inverting terminal and the inverting terminal of the comparators CMP1 and CMP2, respectively. The transistors QP1 and QP2 are turned on and off by the feed back control so that the monitor output VMON becomes equal to the reference voltage VREF.

Connected across the output node QN and nodes for the resisters R1 and R2, R2 and R3, and so on, are switching PMOS transistors QP3, QP4, . . . , controlled by mode control signals /PGM, /PV, and so on.

During writing, a low-level mode-control signal /PGM turns on the transistor QP3. On the other hand, a low-level control signal /PV turns on the transistor QP4 for verification. This switching control attains a word drive voltage, such as, Vg=VPGM in writing and Vg=VPV in verification.

A PMOS transistor QP2 is provided across the terminal VPP and the node QN (Vg-output terminal). A low-level control signal SHOT turns on the transistor QP2 during reading, thus the output voltage VR of the booster circuit 82 for reading appears at the Vg-output terminal as it is.

Figure 4:
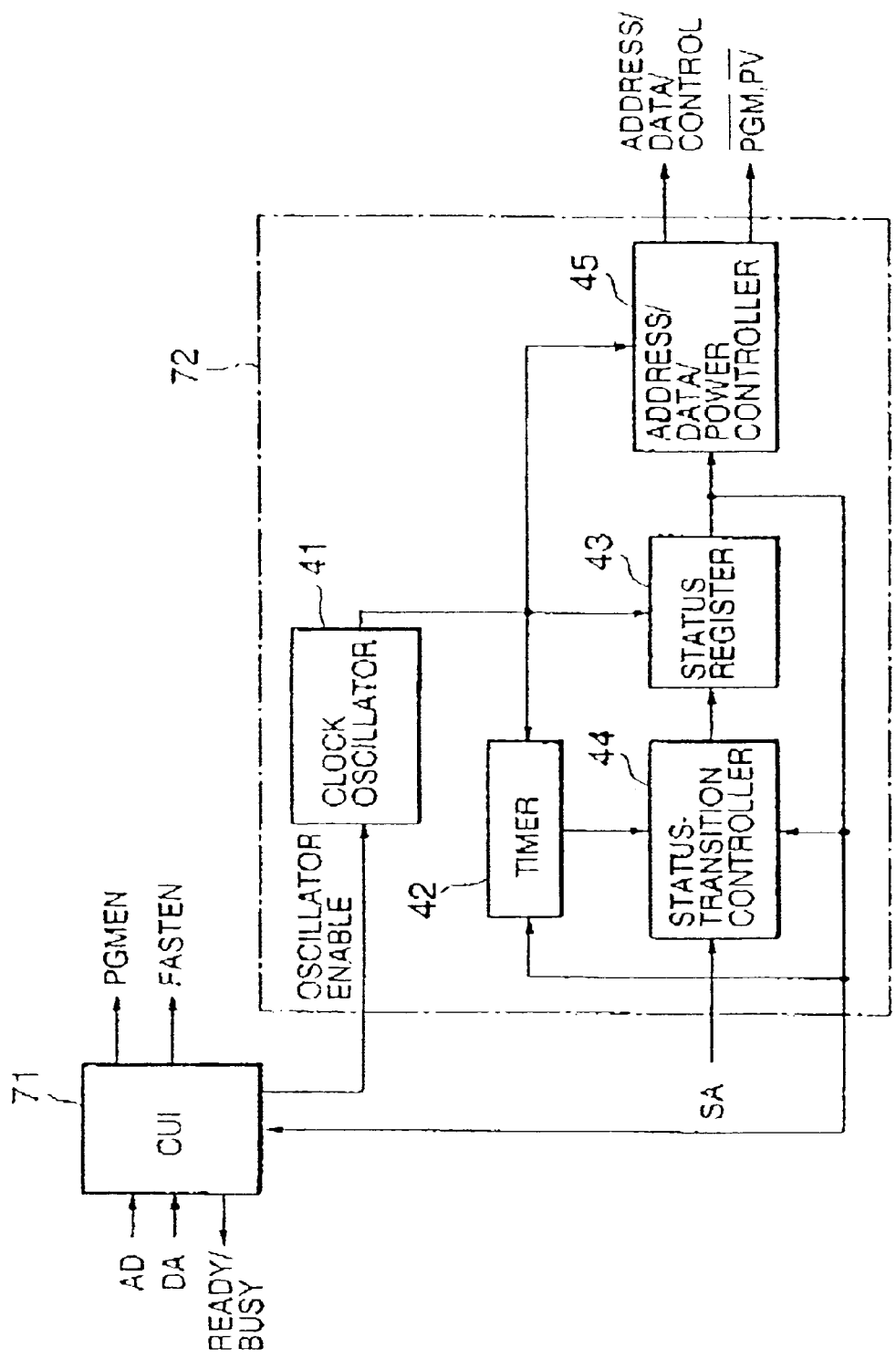
FIG. 4 shows a block diagram of write-state controller in this embodiment.

The control signals /PGM, /PV and /SHOT supplied to the regulator 9 are generated by the WSC 72, a block diagram thereof is shown in FIG. 4.

On receiving a write command, the CUI 71 supplies an oscillator enable signal to a clock oscillator 41 to generate clock signals. The chip housing the circuitry shown in FIG. 1 is controlled in synchronism with the clock signals during the automatic writing operation.

A chip-internal state, such as, on verification, during the automatic writing operation is represented by register values of status register 43.

An address/data/power controller 45 generates control signals to the address/data buffer 6, and control signals, such as, /PGM and /PV to the boosted voltage generator 8 and the regulator 9, according to the chip-internal state.

A status transition, such as, "automatic writing is completed" or "rewriting is executed" according to a verification result is judged by a status-transition controller 44 based on the output of the status register 43 and an output SA of the sense-amplifier 5. Each state is held for a predetermined time period set by a timer 42.

The output of the status register 43 is supplied to the CUI 71 for generating READY and BUSY signals and also an operation-terminating signal for forcing the activating signal PGMEN to the boosted voltage generator 8 to be at a low level (inactive).

Disclosed next is an automatic writing operation for the flash memory in this embodiment.

The flash memory as the preferred embodiment is provided with a regular writing mode and a successive writing mode. The regular writing mode activates and deactivates the booster circuit 81 for writing/erasing for each input of a write address and data. The successive writing mode continuously activates the booster circuit 81 with no intermission during input of a plurality of write addresses and data.

Figure 5:
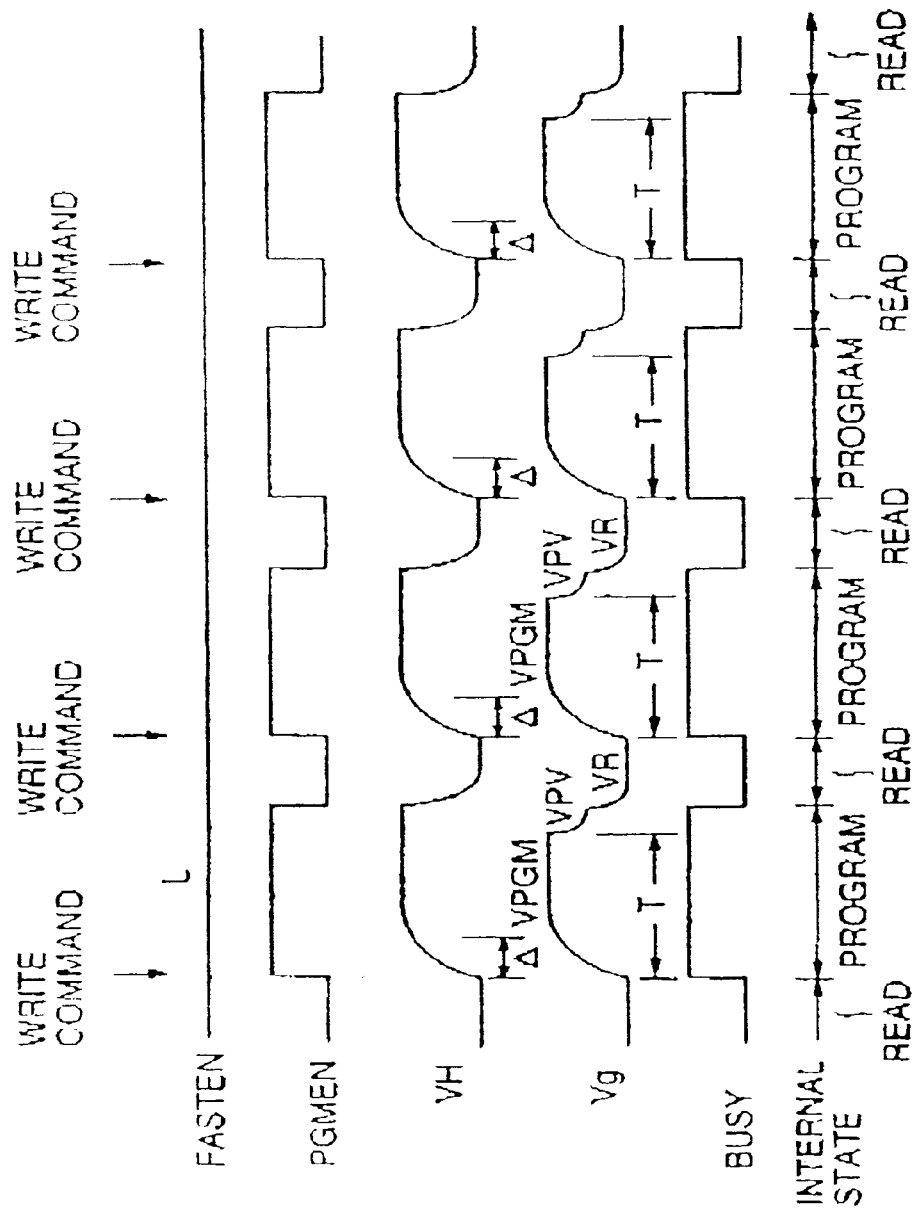
FIG. 5 illustrates a timing chart for a regular writing mode in this embodiment.

Illustrated in FIG. 5 is a timing chart for an operation in the regular writing mode.

Figure 7A:
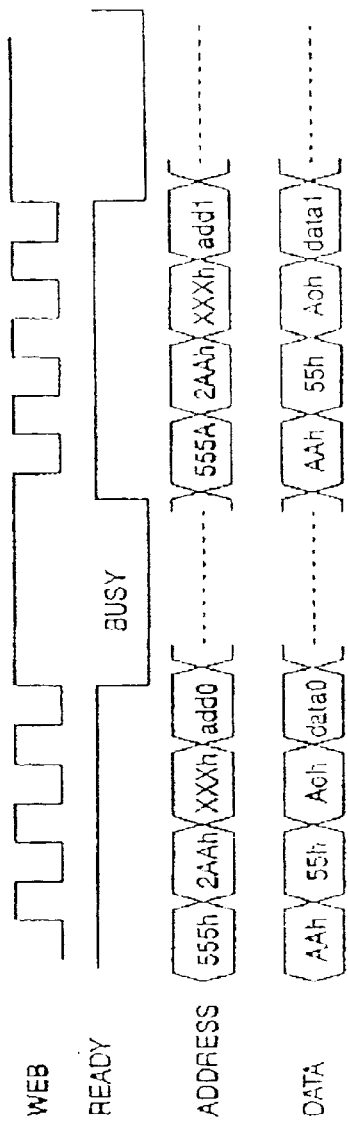
FIGS. 7A and 7B illustrate examples of regular and successive commands.

The regular writing mode is set, for example, as shown in FIG. 7A, by means of a set of write commands, such as, "555h", "2AAh" and "xxxh" in front of each address "add", and "AAh", "55h"; and "A0h" in front each data "data", thus requiring four cycles for each writing operation.

The set of write commands is decoded by the CUI 71 to bring the activating signal PGMEN into a high level whereas it is brought into a low level when the writing operation is completed. This transition of the signal PGMEN activates the booster circuit 81 for writing/erasing to start voltage rising for writing at each address and deactivates it when the writing is completed.

As shown in FIG. 5, the voltage Vg supplied to the control gate of a selected memory cell is at a level VPGM by the regulator 9 during the net writing operation in the write cycle, and brought into a level VPV during verification. The activating signal FASTEN is always at a low level during the regular writing mode.

The signal BUSY is output to the outside of the chip during the automatic writing operation (Program), thus the chip is inaccessible. On completion of the automatic writing operation, the chip is brought into an initial read-waiting mode (Read). The booster circuit 81 for writing/erasing is also brought to a halt in the read-waiting mode. Writing to the next address requires the booster circuit 81 to raise the voltage by re-inputting the write commands.

Figure 6:
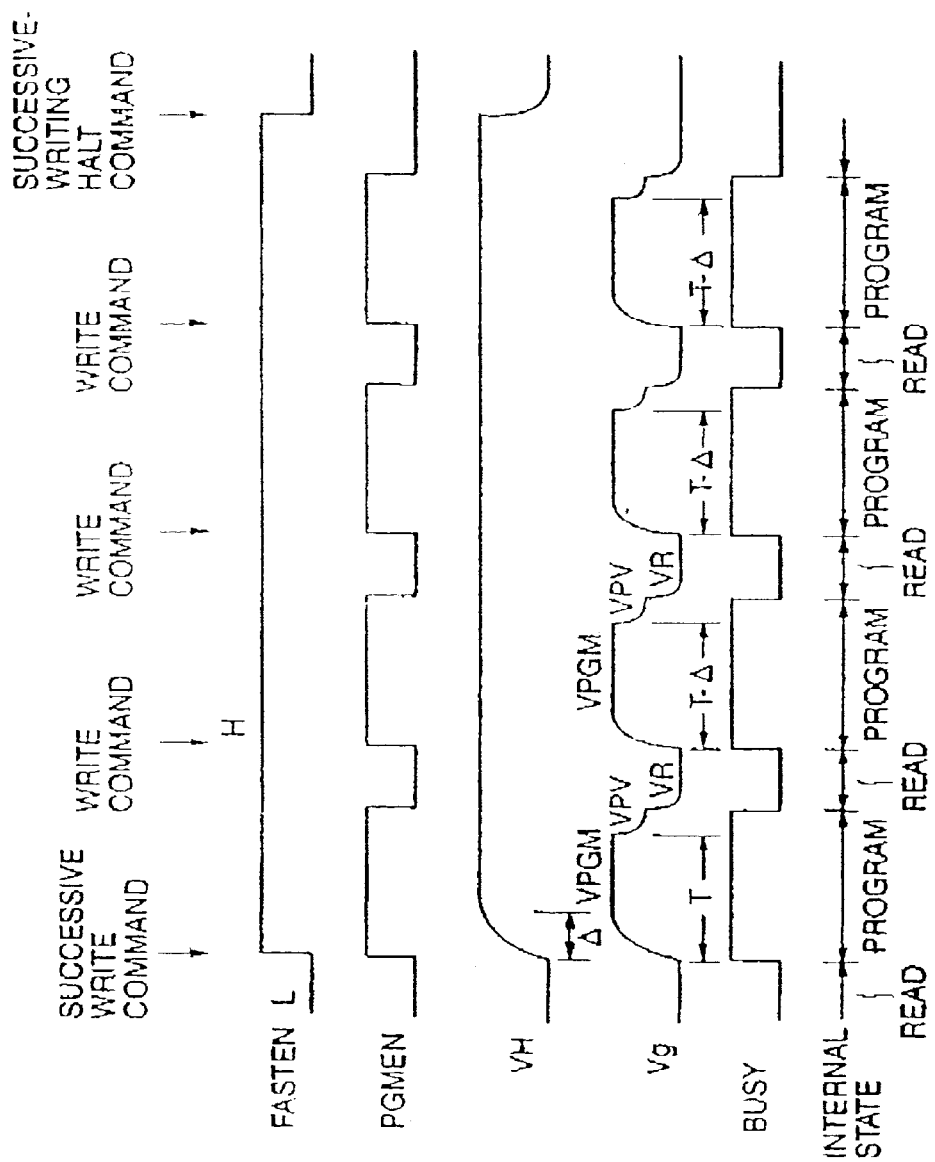
FIG. 6 illustrates a timing chart for a successive writing mode in this embodiment.

Contrary to the regular writing mode, the successive writing mode is executed as illustrated in FIG. 6.

Figure 7B:
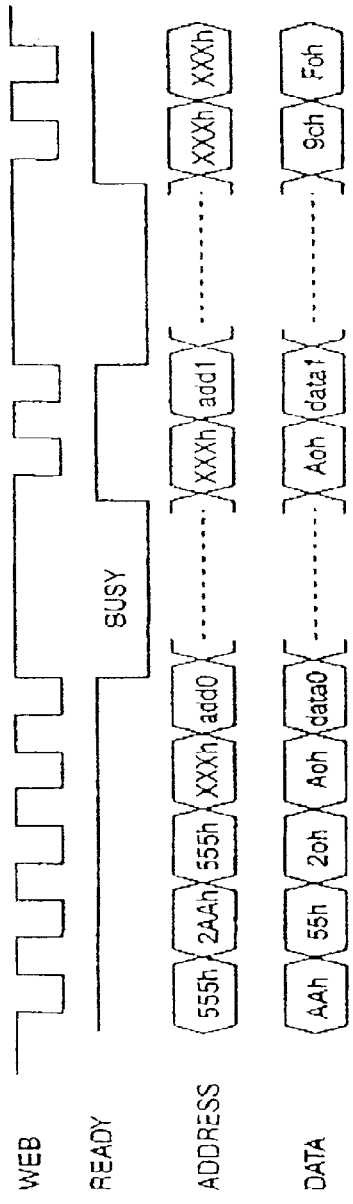

The successive writing mode is set, for example, as shown in FIG. 7B, by means of a set of write commands for successive mode, such as, "555h", "2AAh", "555h" and "xxxh" in front of each address "add"; and "AAh", "55h", "20h" and "A0h" in front each data "data", different from those for the regular writing mode.

The set of write commands is decoded by the CUI 71 to bring the activating signal FASTEN into a high level until a halt command for successive mode is entered. The activating signal PGMEN is brought into a high level for each input of write command whereas it is brought into a low level when the writing operation is completed, like the regular writing mode.

Once the successive writing mode is set, the following respective writing operation requires only two cycle-input with write commands "xxxh" and "A0h" in front of address and data, respectively, as shown. in FIG. 7B.

It is the same for the successive writing mode as the regular mode in that input of write commands, address and data in the read-waiting mode allows repetition of the succeeding writing operation (Program) and read-waiting mode (Read).

The successive writing mode is, however, different from the regular mode in that, during the period of repetition described above, the booster circuit 81 for writing/erasing is continuously activated by the activating signal FASTEN with no intermission. The successive writing mode allows a regular reading operation because there is no signal BUSY in the read-waiting mode.

The input of a predetermined write-halt command for the successive mode, brings the activating signal FASTEN into a low level to force the booster circuit 81 for writing/erasing to be inactive to complete the successive writing mode.

The EEPROM flash memory, having the internal boosted voltage generator 8 shown in FIG. 3, requires voltage control so that the output voltages VH and VR become equal to each other, and provision of the read control signal READ to the transistor QN0 before short-circuiting the voltages VH and VR. This avoids an error in data reading, which would otherwise occur in reading just after writing due to a voltage appearing at the boost output terminal VPP higher than a voltage VR in a regular reading.

Figure 8:
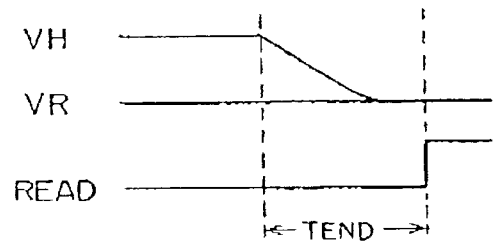
FIG. 8 illustrates a timing chart for explaining an internal voltage reset time required for regular reading in this embodiment.

The regular reading requires an internal voltage reset time TEND, as illustrated in FIG. 8, for achieving VH=VR to provide a complete reading state after each completion of a writing operation. On the other hand, the successive writing mode does not require such a reset time because the output voltage VH is continuously high, thus shortening the writing time by the period corresponding to the internal voltage reset time TEND, which is achieved by changing the output timing for the timer 42 in FIG. 4 according to the mode.

Shortening the writing time is also achieved in the case where a high voltage Vpp is externally supplied. High voltage application achieves writing at a power level smaller than that by the internal boosted voltage generator 8.

In detail, as shown in FIG. 3, an external high voltage Vpp is detected by an external Vpp controller 84 that then generates a high-level signal EXTEN. The signal EXTEN is supplied to a level shifter 85 to turn on a transistor 86 to supply the high voltage to the terminal VPP while the signal EXTEN is supplied to the logic gate 83 to deactivate the booster circuit 81. Successive writing in this case also achieves shortening of the internal voltage reset time TEND shown in FIG. 8 and the waiting period Δ shown in FIG. 5, which is also achieved by changing the output timing for the timer 42 in FIG. 4 to decide status transition timing by means of the signal EXTEN according to the mode.

Figure 9:
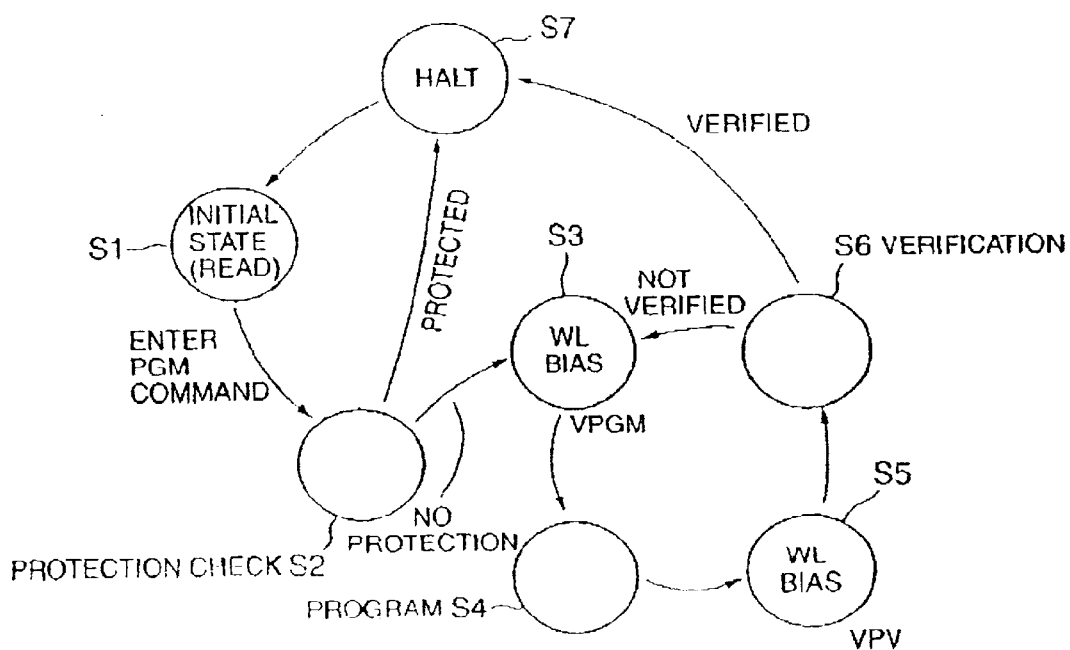
FIG. 9 illustrates a status transition in this embodiment.

Illustrated in FIG. 9 is a status transition of automatic writing control by the WSC 72 in this embodiment. The illustrated transition is applied to both the regular and successive writing modes.

Input of write commands in the initial state (Read) in step S1 initiates judgement as to whether or not writing is inhibited (protection) in step S2. The process is brought to a halt in step S7 if protected. If not, the booster circuit 81 for writing/erasing starts to raise the voltage in step S3 to supply a write voltage VPGM to word lines for data writing (Program in FIGS. 5 and 6) in step S4.

On completion of writing, a write voltage VPV is supplied to the word lines in step S5 for verification in step S6.

If the writing is not sufficient, the write voltage VPGM is supplied again for repetition of writing. If writing is sufficient, the writing operation is completed in step S7, and the chip is set in the initial state (step S1).

As disclosed above, this embodiment offers the following advantages:

The regular writing mode consumes much power for activation and deactivation of the boosted voltage generator for each address designation in writing a large amount of data. Contrary to this, the successive writing mode consumes less power because the boosted voltage generator is continuously active during this writing operation.

Moreover, continuous activation of the booster circuit 81 for writing/erasing in the successive writing mode skips a waiting period for stable voltage generation from the second writing operation, as illustrated in FIGS. 5 and 6.

As shown in FIG. 5, the regular writing mode requires a waiting period Δ for stable voltage generation for each writing operation, thus resulting in always the same voltage-supplying period T to a high write voltage VPGM for each cycle.

On the contrary, as shown in FIG. 6, the successive writing mode requires such a voltage-supplying period T for the initial writing operation, however, a period for supplying a high write voltage VPGM is (T-Δ) from the second writing operation.

Moreover, the successive writing mode requires just two cycles for writing, thus resulting in a short period of occupying CPU (controller 7) compared to the regular writing mode.

Figure 10:
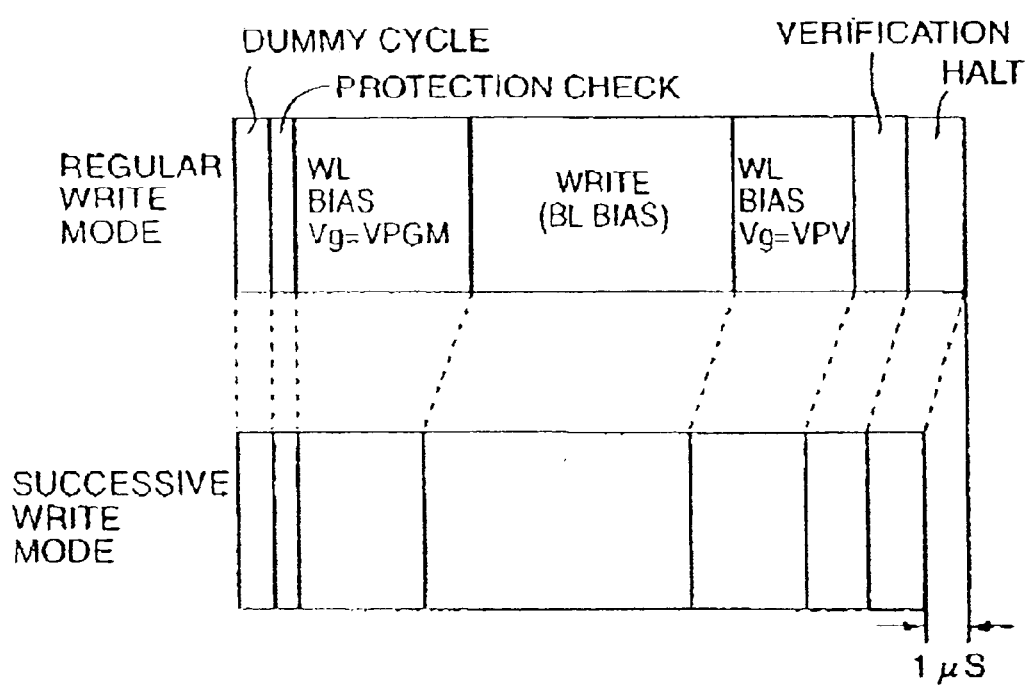
FIG. 10 illustrates a time table for both regular and successive writing modes in this embodiment.

Illustrated in FIG. 10 is a timetable for both the regular and successive writing modes for verification that is made by one writing operation.

As discussed above, the successive writing mode achieves a short operating period because it skips a waiting period for stable voltage generation of the boosted voltage generator from the second writing operation.

The difference in operating period for the successive writing mode from the regular writing mode is about 1 µs in writing one address.

The difference, however, in writing a plurality of addresses increases. For example, 64K-byte writing per 2 bytes in the successive writing mode, is about 3.2 ms shorter than the regular writing mode.

The embodiment disclosed above requires write and halt commands for successive writing in addition to the regular write commands.

The booster circuit 81 for generating a high voltage is always activate in the successive writing mode so that a repeat of the reading operation with no actual writing in this mode consumes power unnecessarily.

To overcome such a drawback, it is effective to set a pseudo-leady state in which the memory cells are accessible under the condition that the booster circuit 81 for writing/erasing is continuously active for a specific period after completion of writing operation without going back to the initial state (read-waiting mode).

Figure 11:
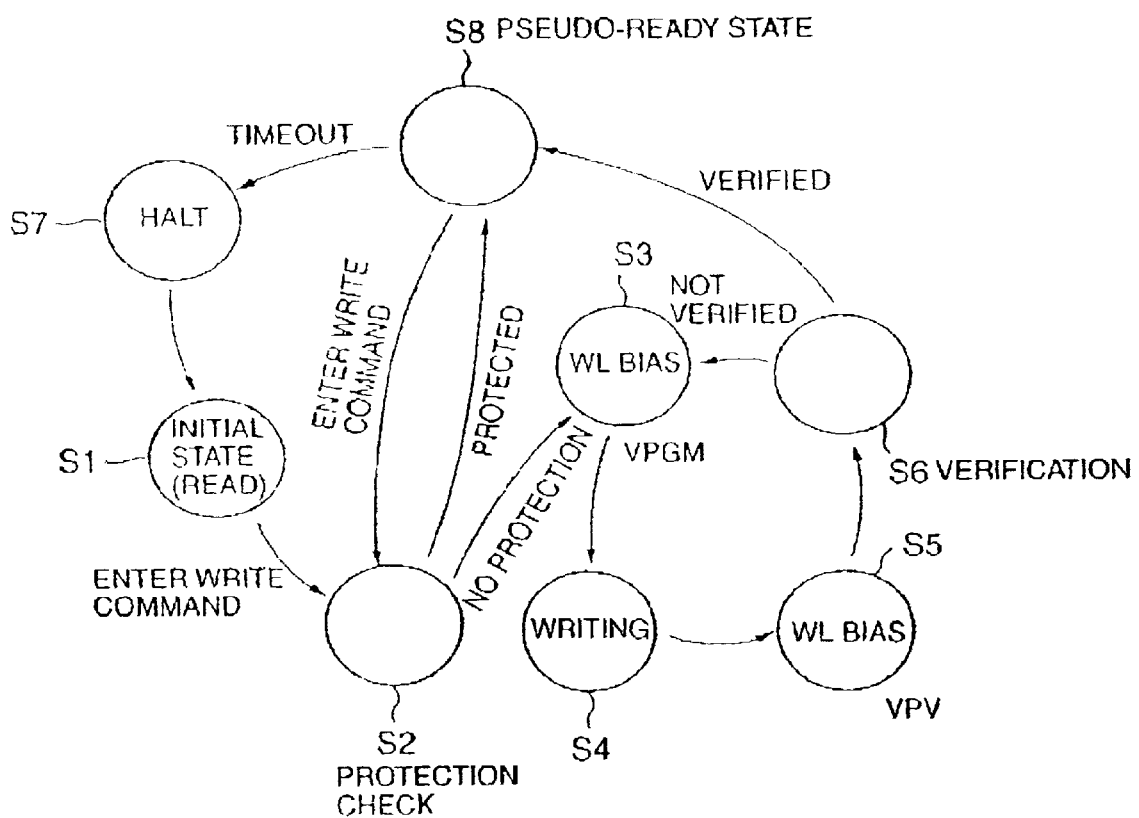
FIG. 11 illustrates a status transition in another embodiment according to the present invention.

Illustrated in FIG. 11 is a status transition with the pseudo-leady state as discussed above. The WSC 72 in this case is preprogrammed to execute the operation shown in FIG. 11.

In FIG. 11, after writing verification is made in step S6, the process goes to the pseudo-leady state in step S8 instead of going back to a halt operation in step S7.

The pseudo-leady state activates the clock oscillator 42 for clock signal generation and the booster circuit 81 for writing/erasing, with the signal READY being output to the outside of the chip to be ready for receiving a write command.

Input of the succeeding write command within a predetermined period in the pseudo-leady state initiates judgement as to whether or not writing is inhibited (protection) in step S2 instead of going back to the halt operation in step S7.

If not protected, the succeeding writing sequence starts. Since the clock oscillator 41 has already been active, a dummy cycle shown in FIG. 10 for stable clocks is not required. Moreover, since the booster circuit 81 for writing/erasing has also been active, a waiting period for stable voltage generation is not required.

On the other hand, no input of the succeeding write command within the predetermined period, in the pseudo-leady state in step S8, initiates the timer 42 to generate a timeout. Thus the process goes back to the halt operation in step S7, and goes to the initial state in step S1. The WSC 72 and the booster circuit 81 for writing/erasing are then deactivated.

As disclosed, activation and deactivation of the booster circuit 81 for writing/erasing in the pseudo-leady state with a watch for that also achieves the successive writing mode like the former embodiment in which the circuit 81 is always active by input of write commands, addresses and data within the predetermined period of the pseudo-leady state.

In this embodiment, a timeout deactivates the booster circuit 81 for writing/erasing to go to the initial state with no input of a halt command for the successive mode.

Figure 12:
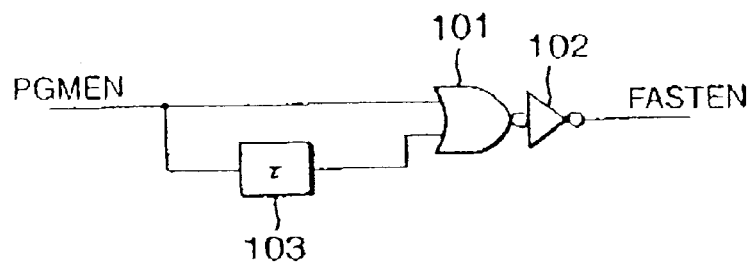
FIG. 12 shows a circuit diagram of an activation circuit for a boosted voltage generator in the other embodiment according to the present invention.

Activation of the booster circuit 81 for writing/erasing in this embodiment is achieved by generation of an activating signal FASTEN by a circuit shown in FIG. 12 using the activating signal PGMEN generated in synchronism with a write command as disclosed in the former embodiment.

In FIG. 12, the activating signal PGMEN is supplied to a NOR gate 101 at one input terminal. The signal PGMEN is further supplied to a delay element 103 and delayed by a period T. The delayed signal is also supplied to the NOR gate 101 at the other input terminal. The output of the NOR gate is inverted by an inverter 102 to generate an activating signal, FASTEN that corresponds to the activating signal PGMEN, the end portion thereof is extended by the period T. The activating signal FASTEN is then supplied to the booster circuit 81 for writing/erasing, as shown in FIG. 3.

Figure 13:
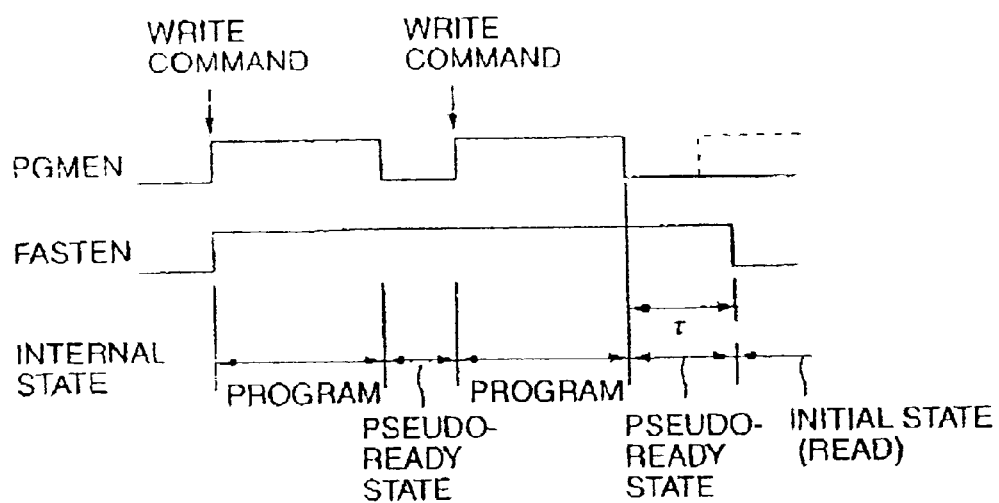
FIG. 13 shows a timing chart for the activation circuit shown in FIG. 12.

Illustrated in FIG. 13 are waveforms for the circuit shown in FIG. 12 to activate the booster circuit 81 for writing/erasing, and the internal state of the chip.

Input of a write command brings the activating signal PGMEN into a low level to set the pseudo-leady state. Input of the succeeding write commands in the pseudo-leady state while not going beyond the period T allows the activating signal FASTEN to be continuously at a high level for the succeeding writing while the booster circuit 81 for writing/erasing has been active.

On the other hand, no input of the succeeding commands before the period T elapses in the pseudo-leady state brings the activation signal FASTEN into a low level to deactivate the booster circuit 81 for writing/erasing, with a timeout to bring the chip into the initial state.

As disclosed above, according to this embodiment, the booster circuit 81 for writing/erasing is not kept active for a long time, thus no power is consumed unnecessarily for the case in which no data is written in the successive writing mode like the former embodiment.

Moreover, according to this embodiment, successive input of addresses, data and write commands offers the successive writing mode like the former embodiment in which the booster circuit 81 for writing/erasing is continuously active, thus achieving reduction of power consumption.

Like the former embodiment, a period of writing a large amount of data is shortened.

The present invention is not limited the foregoing embodiments. Although a NOR-type EEPROM is disclosed as embodiments, the present invention is applicable to other memories, such as, NAND-type EEPROM, DRAM, SRAM and FRAM for which the number of data bits in one writing operation is limited to a large degree according to the number of I/O terminals compared to the number of bit lines in the memory cell array.

As disclose above, the present invention achieves a reduction of power consumption in boosted voltage generation by providing a successive operation mode in which no on-off switching control is performed to the voltage generator for writing to a plurality of addresses entered randomly.

Moreover, the present invention achieves a reduction of a period for writing a large amount of data by skipping a waiting period for stable boosted voltage generation.

What is claimed is:

1. A semiconductor memory comprising:

a memory cell array;

a boosted voltage generator;

a decoder which selects memory cells in said memory cell array in response to an address signal; and a controller which activates said voltage generator, wherein said boosted voltage generator is kept active for a first period in response to input of a first command from said controller, wherein said boosted voltage generator is kept active for a second period longer than the first period in response to input of a second command from said controller.

2. The semiconductor memory according to claim 1, wherein said memory cell array comprises nonvolatile memory cells, said first command being used to set a successive writing mode to a repeatedly-entered plurality of pairs of address signals and the corresponding data signals to be written.

3. The semiconductor memory according to claim 1, wherein said memory cell array comprises nonvolatile memory cells, said controller performing a write-cycle control including a writing operation to said memory cell array, a verifying operation to verify a written state of said memory cell array after said writing operation and repetition of said writing operation when said written state is not sufficient, and halting said writing-cycle when said written state is verified as sufficient.

4. A semiconductor memory comprising:

a memory cell array;

a boosted voltage generator;

a decoder which selects memory cells in said memory cell array in response to an address signal; and a controller which controls said voltage generator, wherein said semiconductor memory is provided with a regular operation mode in which said boosted voltage generator is controlled to be in an active state for a predetermined period by a first control signal output by said controller in response to a predetermined signal, and a successive operation mode in which said boosted voltage generator is controlled to be in said active state for a period longer than the predetermined period by a second control signal output by said controller in response to another predetermined signal.

5. The semiconductor memory according to claim 4, wherein said memory cell array comprises nonvolatile memory cells, wherein data writing is performed under control of said boosted voltage generator to be an active or inactive state for each writing operation in response to said first control signal as a write-enable signal in said regular operation mode, and said boosted voltage generator being kept in active for a period of a plurality of writing operations in response to said second control signal as a successive write-enable signal.

6. A semiconductor memory comprising:

a memory cell array;

a boosted voltage generator;

a decoder which selects memory cells in said memory cell array in response to an address signal; and a controller which activates said boosted voltage generator, wherein said boosted voltage generator is kept active for a first period in response to input of a first command from said controller, wherein said boosted voltage generator is kept active for a second period longer than the first period in response to input of a second command from said controller, whereas said boosted voltage generator is deactivated when said first and said second commands are not input.

7. The semiconductor memory according to claim 6, wherein said memory cell array comprises nonvolatile memory cells, said first and second commands being used to order data writing.

8. The semiconductor memory according to claim 6, wherein said memory cell array comprises nonvolatile memory cells, said controller performing, in response to input of said first command, a write-cycle control of a writing operation to said memory cell array, a verifying operation to verify a written state on said memory cell array after said writing operation and repetition of said writing operation when said written state is not sufficient, setting said memory cell array in an accessible state for a predetermined period while keeping said boosted voltage generator active when said written state, is verified as not sufficient, performing the succeeding write-cycle control without returning to an initial state when receiving said second command within said period, and halting said write-cycle when said second command is not entered within said period.

9. A semiconductor memory comprising:

a memory cell array having nonvolatile memory cells;

a boosted voltage generator;

a sense-amplifier which senses data read from said memory cell array;

a decoder which selects memory cells in said memory cell array in response to an address signal; and a controller which controls an automatic writing operation based on input of a write command, wherein said semiconductor memory is provided with a successive writing mode in which a booster circuit of said boosted voltage generator for writing is kept in an active state without returning to an inactive state for completion of writing to each address in writing to a repeatedly-entered plurality of addresses.

10. The semiconductor memory according to claim 9, wherein said successive writing mode is set by input of a command to order successive writing and halted by another command to order completion of said successive writing.

11. The semiconductor memory according to claim 9, wherein said successive writing mode and a regular writing mode, in which said booster circuit is brought into said inactive state for each completion of said writing operation, can be switched by an external-command input.

12. The semiconductor memory according to claim 9, wherein said successive writing mode is set while said memory cell array is kept in an accessible state in which said booster circuit is kept active for a predetermined period by said controller after completion of said writing operation, and said writing operation is executed by input of a command to order the succeeding writing during said accessible state.

13. The semiconductor memory according to claim 9, wherein said successive writing mode is provided with a waiting period for stable voltage generating of said booster circuit at an early stage of an initial write-cycle, said waiting period being skipped from a second write-cycle.

14. A semiconductor memory comprising:

a memory cell array;

a boosted voltage generator;

a decoder which selects memory cells in said memory cell array in response to an address signal; and a controller which operates by a command to control said voltage generator, wherein the command has a mode in which said boosted voltage generator is kept active for a predetermined period and continues operation in which said boosted voltage generator is kept active for a period longer than the predetermined period.

15. A semiconductor memory comprising:

a memory cell array having nonvolatile memory cells;

a boosted voltage generator;

a sense-amplifier which senses data read from said memory cell array;

a decoder which selects memory cells in said memory cell array in response to an address signal; and a controller which controls an automatic writing operation based on input of a write command, wherein an internal timer level for automatic writing operation varies from that for regular operation in which said boosted voltage generator is kept active for a predetermined period and continues operation in which said boosted voltage generator is kept active for a period longer than the predetermined period.

* * * * *